United States Patent [19]
Kim et al.

[11] Patent Number: 5,946,233
[45] Date of Patent: Aug. 31, 1999

[54] FLASH MEMORY DEVICE HAVING WORD LINE LATCH FOR MULTI-BIT PROGRAMMING

[75] Inventors: Joo Young Kim, Seoul; Jong Bae Jeong, Kyungki-Do; Jong Seuk Lee, Kyungki-Do; Young Dong Joo, Kyungki-Do, all of Rep. of Korea

[73] Assignee: Hyundai Electronics Industries Co., Ltd, Kyungki-Do, Rep. of Korea

[21] Appl. No.: 09/099,365

[22] Filed: Jun. 18, 1998

[30] Foreign Application Priority Data

Jun. 30, 1997 [KR] Rep. of Korea .................. 97-30128

[51] Int. Cl.⁶ .................................................. G11C 16/06
[52] U.S. Cl. .............................. 365/185.12; 365/185.23; 365/185.33
[58] Field of Search ................... 365/185.23, 185.12, 365/185.33

[56] References Cited

U.S. PATENT DOCUMENTS

| 4,805,151 | 2/1989 | Terada et al. | 365/189.07 |
| 4,893,281 | 1/1990 | Hashimoto | 365/230.06 |
| 4,953,129 | 8/1990 | Kobayashi et al. | 365/185.12 |

*Primary Examiner*—Andrew Q. Tran
*Attorney, Agent, or Firm*—Cohen, Pontani, Lieberman & Pavane

[57] ABSTRACT

This invention relates to a flash memory device capable of performing a multi bit program by sequentially supplying a data stored on a data storage circuit to a word line coupled to a select gate of a memory cell selected by a row decoder when a program bias voltage is applied to a bit line.

5 Claims, 3 Drawing Sheets

FLASH MEMORY DEVICE HAVING WORD LINE LATCH FOR MULTI-BIT PROGRAMMING

BACKGROUND OF THE INVENTION

1. Field of the Invention

This invention relates to a flash memory device, in particular to a flash memory device that can program multi bits.

2. Description of a Related Prior Art

Generally, a flash memory device has both functions of electrical program and erasure. The flash memory device comprises a memory cell array and a peripheral circuit. The memory cell array has a plurality of memory cells which are arranged in matrix form between a word line and a bit line. The peripheral circuit has a power supply circuit and a circuit related to input and output of a data.

Such a conventional flash memory device will be briefly explained with reference to FIG. 1 as follows.

A conventional flash memory device comprises a memory cell array 1 in which a plurality of memory cells are connected in matrix form between a word line and a bit line, a row decoder 2 to supply a bias voltage into a select gate electrode of a memory cell selected by a word line and a column decoder 3 to supply a bias voltage into a drain electrode of a memory cell selected by a bit line.

The memory cell is classified into a stacked gate type and a split gate type according to form of a gate electrode. A memory cell having a split gate type is shown in FIG.2.

Referring to FIG. 2, a gate electrode, in which a tunnel oxide layer 5, a floating gate 6, a dielectric layer 7 and a control gate 8 are stacked, is formed on a silicon substrate 4. A drain 9 is formed in the silicon substrate 4 under a side of the gate electrode. A select gate 11 is formed on the silicon substrate 4 including the gate electrode, the select gate 11 being electrically isolated from the silicon substrate 4 and the gate electrode by a select gate oxide layer 10. A source 12 is formed in the silicon substrate 4 under the select gate 11, in which the source 12 is spaced from the drain 9 in constant distance.

To program information on the memory cell, that is, to store an electron charge into the floating gate 6, a voltage of 13 volt is applied to the control gate 8, a voltage of 1.8 volt is applied to the select gate 11, a voltage of 5 volt is applied to the drain 9, and the source 12 and the silicon substrate 4 are grounded. Hence, a select channel is formed in the silicon substrate 4 under the select gate 11 by means of the voltage applied to the select gate 11, and a channel is also formed in the silicon substrate 4 under the floating gate 6 by means of the high voltage applied to the control gate 8. A drain current flow through the select channel and a high electric field is formed in the channel under the floating gate 6. Some of the electrons existing in the channel become hot electrons since the electrons obtain energy during passing the high electric field region. Some of the hot electrons are injected to the floating gate 6 through the tunnel oxide layer 5 due to the vertical electric field formed by the high voltage applied to the control gate 8. Hence, the threshold voltage $V_T$ of the flash memory cell is raised.

To program a memory cell of the flash memory device described above, a bias voltage is selectively applied to a drain under a high voltage is applied to a word line and a source is ground. To make the flash memory device be have multi-bits program functions, a data buffer should be connected to a column multiplexer so that a bias voltage is applied to each drain of memory cells of multi-bits. In this case, the drain is affected stress since unnecessary bias voltage is applied to each drain of residual cells except for some memory cells that are to be program in the memory cells existing in an identical column. In particular, in case of that the memory cells existing in an identical column are divided into a plurality of sectors, the drain stress is occurred as much as it that multiplies by cycling frequency and number of the sectors.

SUMMARY OF THE INVENTION

Therefore, it is an object of the present invention to provide a flash memory device which can solve the above problem by sequentially supplying a data stored on a data storage circuit to a word line through a row decoder under program bias voltage is applied to a bit line.

To accomplish the above object, a flash memory device according to the present invention comprises a memory cell array having a plurality of memory cells coupled between a word line and a bit line in matrix type; a row decoder for supplying a bias voltage to a select gate of the selected memory cell through the word line; a column decoder for supplying a bias voltage to a drain of the selected memory cell through the bit line, the column decoder receiving an address signal; and a data storage circuit to sequentially latch a program data being input in response to a first and second clock signals and for supplying the latched program data to the word line coupled to a select gate of the selected memory cell through the row decoder.

The data storage circuit of this invention comprises a first transistor coupled between a data input terminal and a first node, the first transistor being operated by the first clock signal; a first latch circuit coupled between said first node and a second node; a second transistor coupled between the second node and a third node, the second transistor being operated by the second clock signal; a second latch circuit coupled between a data output terminal and the third node; an inverter connected between a program enable signal input terminal and a first enable terminal of the second latch circuit; a third transistor connected between a ground and the first node, the third transistor being operated by a reset signal inputted through a reset signal input terminal; a fourth transistor connected between a supplying voltage source and the third node, the fourth transistor being operated by the reset signal.

BRIEF DESCRIPTION OF THE DRAWINGS

For a full understanding of the nature and objects of the present invention, reference should be made to the following detailed descriptions made in conjunction with the accompanying drawings in which.

Similar reference characters refer to similar parts through the several views of the drawings.

DETAILED DESCRIPTION OF THE INVENTION

This invention utilizes a split type flash memory cell that is selectively operated by a bias voltage applied to a select gate. In case of using a flash memory device adapting the split gate type memory cell, it is possible to program a plurality of memory cells existing in a column.

Below, this invention will be explained in detail with reference to attached drawings.

Figure 1:
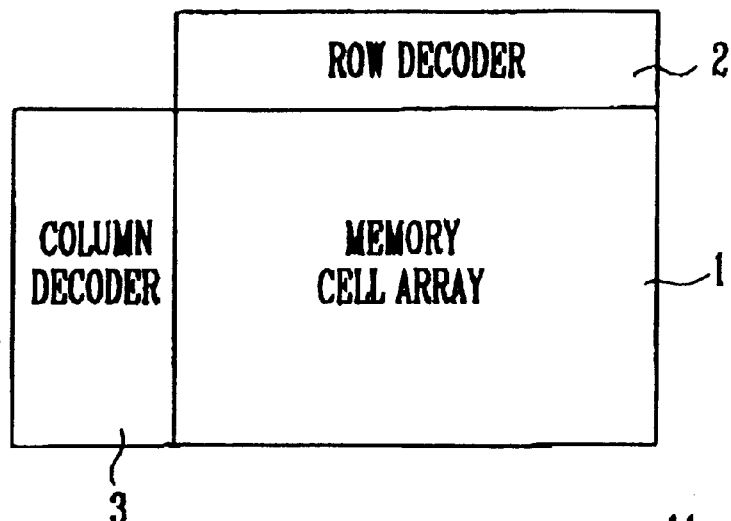
FIG. 1 illustrates a block diagram for explaining a conventional flash memory device.
Figure 2:
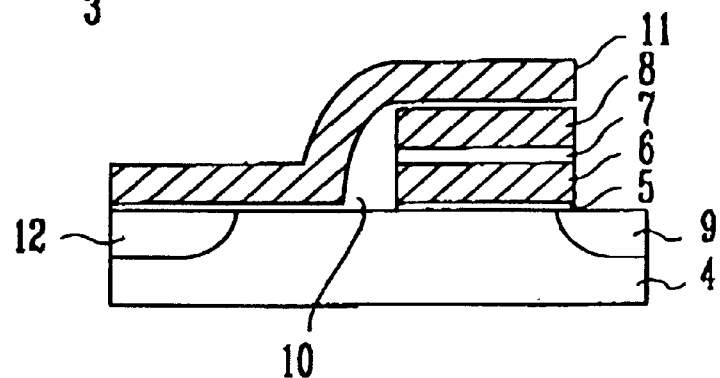
FIG. 2 illustrates a sectional view of a memory cell for explaining a program operation of a conventional flash memory device.
Figure 3:
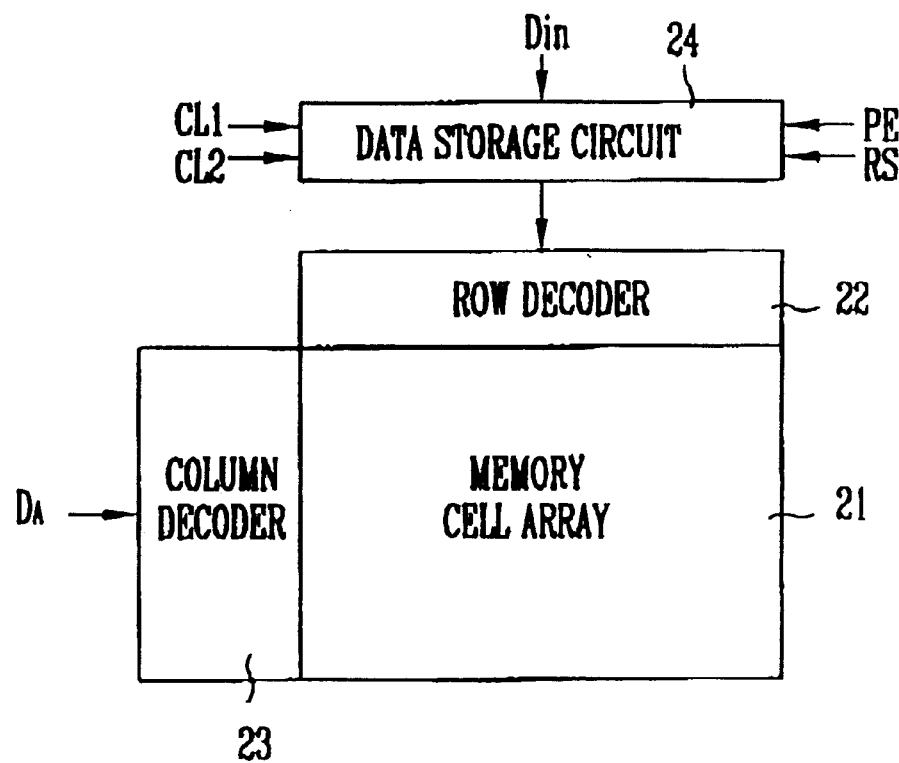
FIG. 3 illustrates a block diagram for explaining a flash memory device according to the present invention.
Figure 4:
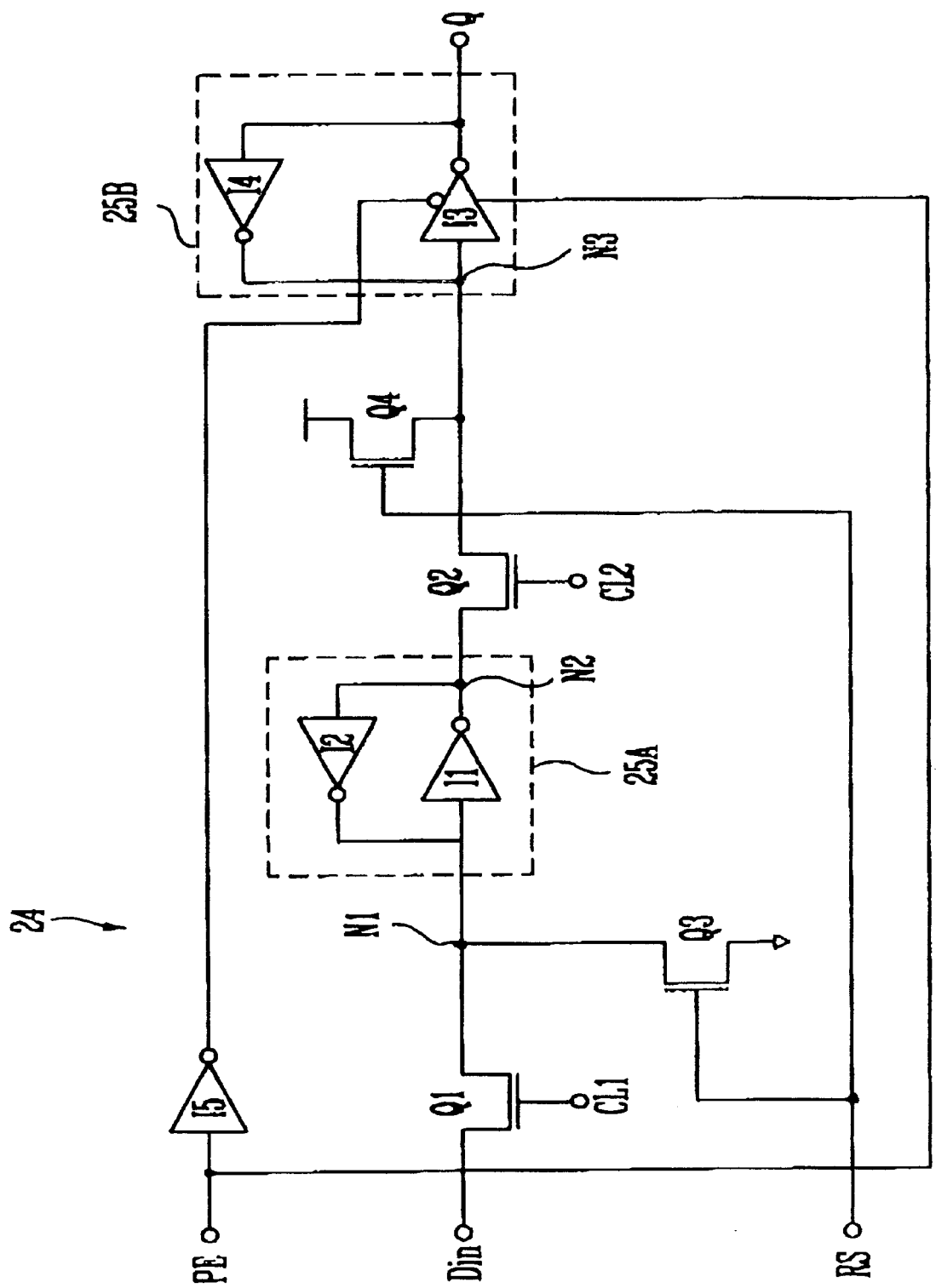
FIG. 4 illustrates a detailed circuit of a data storage circuit shown in FIG. 3.

FIG. 3 illustrates a block diagram for explaining a flash memory device according to the present invention and will be explained by reference to FIG. 4.

A flash memory device of the present invention includes a memory cell array 21, a row decoder 22, a column decoder 23 and a data storage circuit 24 (Explanation to a peripheral circuit will be omitted). In the memory cell array 21, a plurality of memory cells are connected between a word line and a bit line in matrix form, the row decoder 22 is constructed to apply a bias voltage to a select gate of the memory cell selected by an output data of the data storage circuit 24. The column decoder 23 is constructed to receive an address signal $D_A$ and to apply a bias voltage to a drain of the memory cell selected by the bit line. The data storage circuit 24 of the present invention will be explained with reference to FIG. 4 as follows.

A first transistor Q1 is connected between a data input terminal Din and a first node N1, the first transistor Q1 being operated by a first clock signal CL1. A first latch circuit 25A for latching a data is connected between the first node N1 and a second node N2, the first latch circuit 25A comprises first and second inverters I1 and I2 that are connected in parallel from each other. A second transistor Q2 is connected between the second node N2 and a third node N3, the second transistor Q2 being operated by a second clock signal CL2. A second latch circuit 25B for latching a data is connected between the third node N3 and a data output terminal Q, the second latch circuit 25B comprises third and fourth inverters I3 and I4 that are connected in parallel from each other. A fifth inverter I5 is connected between a program enable signal input terminal PE and a first enable terminal of the third inverter I3, the program enable signal input terminal PE being connected to a second enable terminal of the third inverter I3.

A third transistor Q3 is connected between the first node N1 and a ground, the third transistor Q3 being operated by a signal inputted through a reset signal input terminal RS. A fourth transistor Q4 is connected between the third node N3 and a voltage supply terminal, the fourth transistor Q4 being operated by the signal input through the reset signal input terminal RS.

Program operation of the flash memory device including the data storage circuit 24 of FIG. 4 will be explained with reference to FIG. 3 and FIG. 5.

Figure 5:
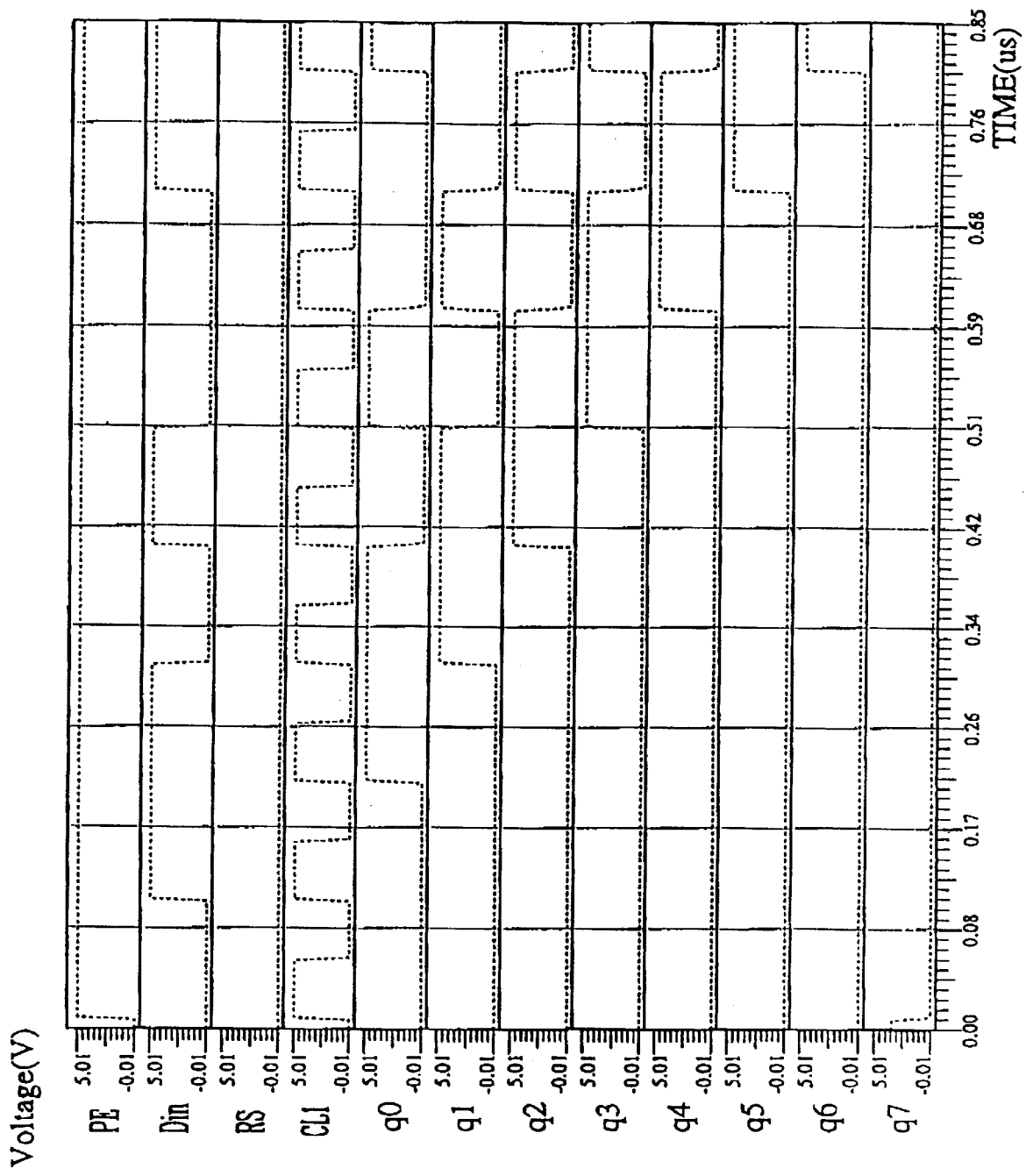
FIG. 5 illustrates a timing diagram for explaining a program operation of a flash memory device according to the present invention.

When the address data $D_A$ is applied to a bit line of the memory cell array 21 through the column decoder 23 and a program enable signal is applied through the program enable input signal terminal PE as shown in FIG. 5, the third inverter I3 is enabled. When a program data is inputted through the data input terminal Din and the first clock CL1 of high state is inputted, the inputted program data is latched to the first latch circuit 25A in response to turning on of the first transistor Q1. Since phase of the second clock signal CL2 is inversion with phase of the first clock signal CL1, the second transistor Q2 is turned off. When the first clock signal CL1 become a low level, the data latched to the first latch circuit 25A is latched to the second latch circuit 25B by turning on of the second transistor Q2.

As described above, the program data is sequentially latched to the first and second latch circuits 25A and 25B in response to changes of the first and second clock signals CL1 and CL2, and then is applied to the word line of the memory cell array 21 through the row decoder 22. FIG. 5 depicts process in which program data q0 through q7 are sequentially transitted. The data latched to the first and second latch circuits 25A and 25B are sequentially inputted to the row decoder 22 and applied to a word line of the memory cell array 22. Hence, the flash memory device enables the whole memory cells existing on a selected column to program according to the program data being input. For reference, when a reset signal having a high state is inputted through the reset signal input terminal RS, the first and second latch circuits 25A and 25B are initialized by turning on of the third and fourth transistors Q3 and Q4.

As described above, this invention enables the program data being input under a bias voltage is applied to a bit line connected to a drain of memory cells existing on a column to latch sequentially on the data storage circuit. The latched program data is supplied to each word line of the memory cells existing on the memory cell array through the row decoder. Such a program operation is different from a conventional program operation that a bias voltage being applied to a drain decides a program operation. According to the present invention, it is possible to perform a multi bit program and effectively decrease the stress affecting to a drain. Also, a program current of a memory cell having a split gate type is smaller than that of a memory cell having a stack gate type since the memory cell having a split gate type uses a source side injection while the memory cell having a stack gate type uses a drain side injection. Therefore, the present invention can perform an effective multi bit program.

Many modifications and variations may be made in the techniques and structures described and illustrated herein without departing from the spirit and scope of the present invention. Accordingly, it should be understood that the techniques and structures described and illustrated herein are illustrative only and are not to be considered as limitations upon the scope and spirit of the present invention.

What is claimed is:

1. A flash memory device comprising:
    a memory cell array having a plurality of memory cells coupled between a word line and a bit line in matrix type;
    a row decoder supplying a first bias voltage to a select gate of a selected memory cell through the word line;
    a column decoder supplying a second bias voltage to a drain of the selected memory cell through the bit line, the column decoder receiving an address signal; and
    a data storage circuit sequentially latched a program data being input in response to a first and second clock signals and supplying the latched program data to the word line coupled to the select gate of the selected memory cell through the row decoder.

2. The device of claim 1, wherein the data storage circuit comprises:
    a first transistor coupled between a data input terminal and a first node, the first transistor being operated by the first clock signal;
    a first latch circuit coupled between said first node and a second node;
    a second transistor coupled between said second node and a third node, the second transistor being operated by the second clock signal;

a second latch circuit coupled between a data output terminal and the third node;

an inverter connected between a program enable signal input terminal and a first enable terminal of the second latch circuit;

a third transistor connected between a ground voltage and the first node, the third transistor being operated by a reset signal inputted through a reset signal input terminal;

a fourth transistor connected between a supplying voltage source and the third node, the fourth transistor being operated by the reset signal.

3. The device of claim 2, wherein the first latch circuit has a first and second inverters that are coupled in parallel for latching data.

4. The device of claim 2, wherein the second latch circuit has a third and fourth inverters that are coupled in parallel for latching data.

5. The device of claim 2, wherein a second enable terminal of the second latch circuit is connected to the program enable signal input terminal.

* * * * *